US009287107B2

(12) United States Patent
Powell

(10) Patent No.: US 9,287,107 B2
(45) Date of Patent: Mar. 15, 2016

(54) LIGHT BULB STORAGE AND TESTING ASSEMBLY

(71) Applicant: Kathy G. Powell, Wichita, KS (US)

(72) Inventor: Kathy G. Powell, Wichita, KS (US)

( * ) Notice: Subject to any disclaimer, the term of this patent is extended or adjusted under 35 U.S.C. 154(b) by 61 days.

(21) Appl. No.: 14/208,510

(22) Filed: Mar. 13, 2014

(65) Prior Publication Data
US 2014/0225619 A1 Aug. 14, 2014

(51) Int. Cl.
*A47F 7/00* (2006.01)
*A47F 5/08* (2006.01)
*H01K 3/30* (2006.01)
*A47G 29/00* (2006.01)
*H01K 3/32* (2006.01)
*G01R 31/44* (2006.01)

(52) U.S. Cl.
CPC ............... *H01K 3/305* (2013.01); *A47G 29/00* (2013.01); *H01K 3/32* (2013.01); *G01R 31/44* (2013.01)

(58) Field of Classification Search
CPC ......... H01K 3/305; H01K 3/32; A47G 29/00; G01R 31/44
USPC ..................... 324/403; 211/26, 113
See application file for complete search history.

(56) References Cited

U.S. PATENT DOCUMENTS

| 3,666,113 | A | 5/1972 | Burrell et al. |
| 3,967,666 | A | 7/1976 | Farrar |
| 4,026,416 | A * | 5/1977 | Cain ................ A47F 7/0028 211/26 |
| 4,585,127 | A | 4/1986 | Benedict |
| 4,760,926 | A | 8/1988 | Iuni |
| 4,949,843 | A | 8/1990 | Stokes |
| 5,048,676 | A | 9/1991 | Borgis et al. |
| D323,756 | S | 2/1992 | Simpson |
| 5,188,231 | A | 2/1993 | Kivell et al. |
| 5,533,534 | A | 7/1996 | Cariello et al. |
| 5,934,468 | A | 8/1999 | Scott |
| D427,781 | S | 7/2000 | Rogman et al. |
| D429,897 | S | 8/2000 | Rogman |
| 6,135,283 | A | 10/2000 | Huang |
| 6,142,314 | A | 11/2000 | Cotterill |
| 1,034,762 | A1 | 8/2012 | Brown |
| 2004/0140282 | A1 * | 7/2004 | Wang ........................... 211/113 |
| 2009/0301914 | A1 | 12/2009 | Kahle |

(Continued)

FOREIGN PATENT DOCUMENTS

CA 2163273 5/1997

OTHER PUBLICATIONS

Walmart, Inc., "Save on smart home storage solutions" Walmart.com published Mar. 12, 2014 (2 pgs.).

(Continued)

*Primary Examiner* — Melissa Koval
*Assistant Examiner* — Farhana Hoque
(74) *Attorney, Agent, or Firm* — Kenneth H. Jack; Davis & Jack, L.L.C.

(57) ABSTRACT

A light bulb storage and testing assembly incorporating a flexible sheet having upper and lower ends, and having front and rear sides; a support frame having upper and lower ends, and having front and rear sides, the flexible sheet's upper end being fixedly attached to the support frame's lower end; a hanger fixedly attached to the support frame's upper end; first and second pluralities of light bulb receptacles respectively fixedly attached to the flexible sheet's front and rear sides; an electronic bulb tester; and mounting brackets adapted for alternatively positioning the electronic bulb tester on either side of the support frame.

14 Claims, 3 Drawing Sheets

(56) References Cited

U.S. PATENT DOCUMENTS

2011/0089064 A1 4/2011 Swann
2012/0067754 A1 3/2012 Holben

OTHER PUBLICATIONS

Ningbo Ninshing Co., Ltd. (no title) nbasp.com published Mar. 12, 2014 (relevant pp. 6-7).

* cited by examiner

LIGHT BULB STORAGE AND TESTING ASSEMBLY

FIELD OF THE INVENTION

This invention relates to apparatus and articles which are adapted for storage of light bulbs. This invention further relates to apparatus adapted for electronic testing of light bulbs.

BACKGROUND OF THE INVENTION

In common usage, light bulbs such as incandescent light bulbs and fluorescent light bulbs are stored in homes upon closet or cabinet shelves. Typically, such bulbs are arranged thereon while encased within thin cardboard canisters or boxes. Such common mode of storage of light bulbs often undesirably leads to inter-mixings and disorganization of various sizes of types of light bulbs, and creation of difficulties in seeing and retrieving any particular needed light bulb.

Upon finding and retrieval of a needed light bulb, a householder often is unable to accurately determine whether the bulb is operable with filament intact or is a defective inoperable bulb, often leading to wasted time and effort in installation of defective and inoperable bulbs.

The instant inventive light bulb storage and testing assembly solves or ameliorates the problems, defects, and challenges noted above by providing a specially configured bulb storage container which may conveniently hang upon a clothing rod within a closet, which effectively and sensibly organizes bulbs according to type, size, and wattage, which displays various types of bulbs for ease of selection and access, and which facilitates immediate testing of bulbs for operability.

BRIEF SUMMARY OF THE INVENTION

A first structural component of the instant inventive light bulb storage and testing assembly comprises a flexible sheet. In the preferred embodiment, the flexible sheet component is rectangular and is vertically oblongated, the rectangle having a lateral dimension between 18" and 30", and the rectangle having a vertical dimension between 30" and 45". The flexible sheet component may be suitably composed of vinyl or woven cotton or synthetic fiber.

A further structural component of the instant inventive assembly comprises a support frame which is fixedly attached to the upper end of the flexible sheet. In a preferred embodiment, the support frame is substantially rigid and has a lower end which spans laterally across and consistently supports the lateral span of the upper end of the flexible sheet.

A further structural component of the instant inventive assembly comprises hanging means which are fixedly attached to and are operatively positioned at the support frame's upper end. Suitably, the hanging means may comprise mounting eyes or other commonly known fastening means. In the preferred embodiment, the hanging means comprises a swivel mounted hook similar to that of a common suit or dress hangar.

Further structural components of the instant inventive assembly comprise at least a first, and preferably first and second pluralities of light bulb receptacles. Where first and second pluralities of light bulb receptacles are provided, the first plurality is preferably fixedly attached to the flexible sheet's front side, and the second plurality is preferably fixedly attached to the flexible sheet's reverse, rear, or back side. In the preferred embodiment, the light bulb receptacles are variously sized for accommodating different sizes of light bulbs, and each receptacle is preferably configured as an upwardly opening bulb receiving pocket. Preferably each pocket's upper opening or lip incorporates an elastic band which may alternatively expand for ease for insertion and receipt of a light bulb, and which may alternately contract over a received bulb following insertion for secure retention of the bulb within the pocket.

A further structural component of the instant inventive assembly comprises electronic bulb testing means which are adapted for sensing and signaling the operability or inoperability of light bulbs stored within the bulb retaining pockets. In a preferred embodiment, the electronic bulb testing means comprise a combination of a "V" channel having electrodes mounted to its side wall and floor, electronic sensory output means, electric power means, and a network of electrically conductive wires interconnecting the electrodes, the electronic sensory output means, and the electronic power means. In the preferred embodiment, the "V" channel's electrodes are sized and positioned for contact with various sizes and diameters of light bulb screw bases.

A further structural component of the instant inventive assembly comprises mounting means which are at least adapted for positioning the electronic bulb testing means upon the support frame below the hanger means, and preferably positioned upon the front face of the support frame. In use of the instant inventive assembly and upon support of the electronic bulb testing means by the mounting means, a user may select a light bulb from one of the bulb receptacle pockets, and may extract the bulb therefrom. Thereafter, the user may insert the screw base of the bulb into the "V" channel so that paired electrodes at the screw base of the bulb make electrical contacts with the paired electrodes within the "V" channel. In the event that such bulb is operable with filament intact, such "V" channel insertion step effectively closes and actuates an electric circuit which includes the electronic sensory output means. In the event of bulb inoperability due to a broken filament, the circuit remains open at the broken filament, and the sensory output means remains deactivated, such lack of circuit actuation advantageously notifying the user that the bulb is inoperable.

Accordingly, objects of the instant invention include the provision of light bulb storage and testing assembly which incorporates structures as described above, and which arranges those structures in relation to each other in manners described above, for achievement of the advantages and benefits set out above.

In the preferred embodiment, bulb pockets are presented at both sides of the flexible sheet and the mounting means are adapted for alternatively supporting the electronic bulb testing at either the front or rear side of the support frame.

Other and further objects, benefits, and advantages of the present invention will become known to those skilled in the art upon review of the Detailed Description which follows, and upon review of the appended drawings.

DETAILED DESCRIPTION OF A PREFERRED EMBODIMENT

Figure 1:
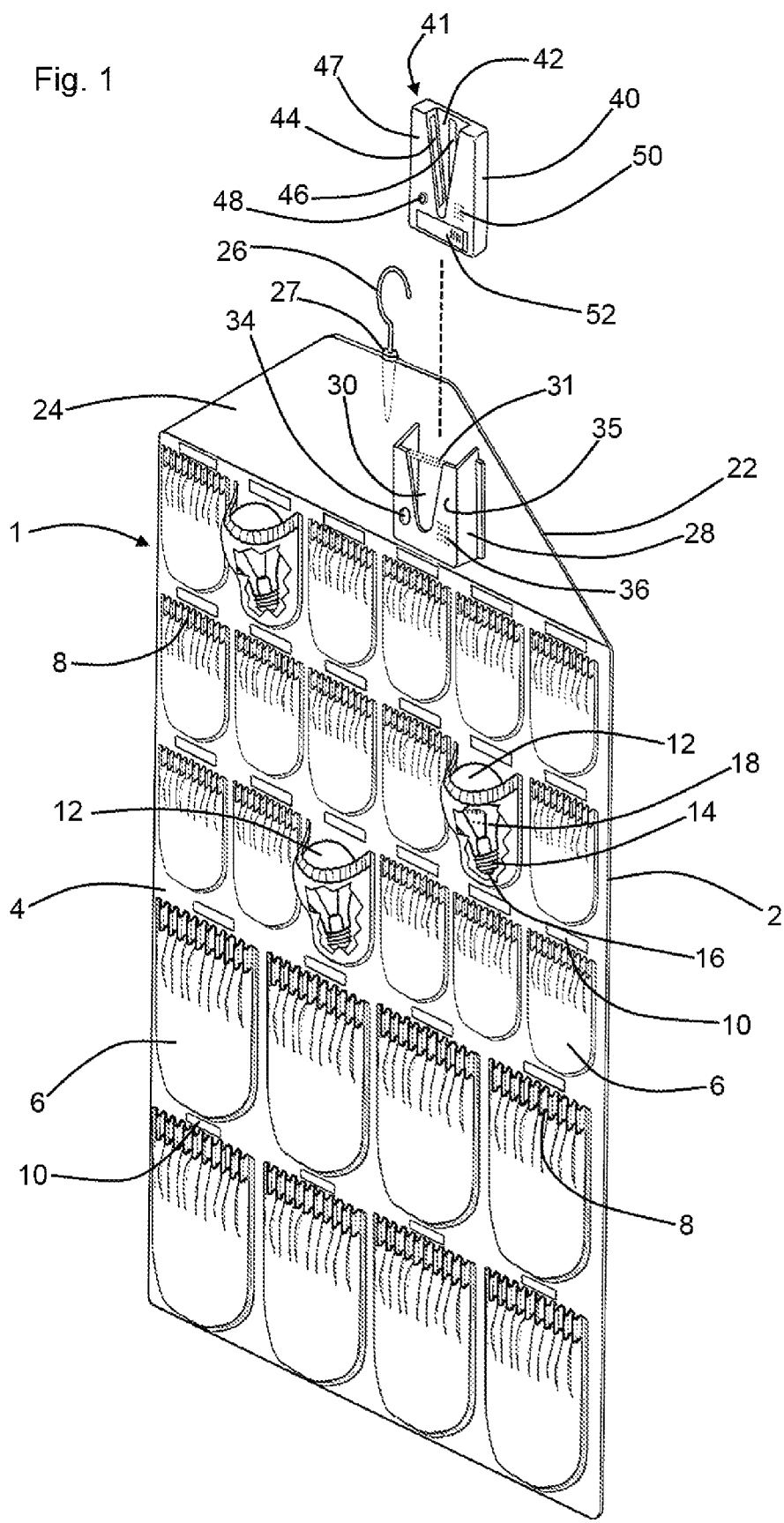
FIG. 1 is a front view of the instant inventive light bulb storage and testing assembly.
Figure 2:
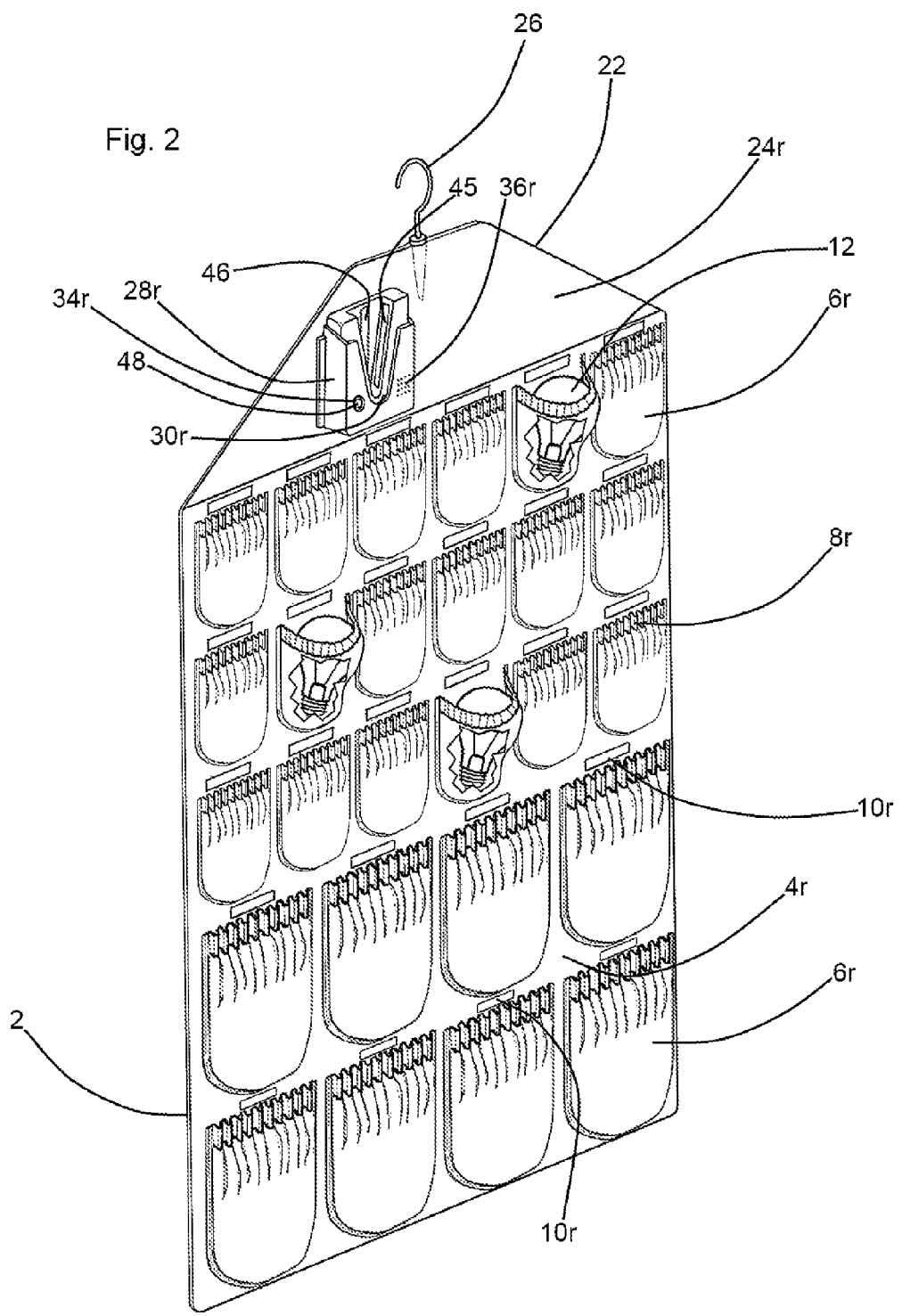
FIG. 2 presents a reverse view of the structure of FIG. 1, the view of FIG. 2 showing a bulb testing component alternatively rearwardly mounted.

Referring now to the drawings, and in particular to Drawing FIGS. 1 and 2, the instant inventive light bulb storage and testing assembly is referred to generally by Reference Arrow 1. The assembly 1 preferably comprises a flexible sheet 2 having a front side 4 and a back or rear side 4r. The flexible sheet is preferably composed of woven fabric or vinyl.

A further structural component of the instant inventive assembly comprises a support frame 22 having a front side 24 and a rear side 24r. In the preferred embodiment, the support frame 22 is substantially rigid relative to the flexible sheet 2, and the lower end of the support frame 22 is preferably fixedly attached to the upper end of the flexible sheet 2.

First and second pluralities of light bulb receptacles are preferably respectively fixedly attached to the front and rear sides 4 and 4r of the flexible sheet 2, such receptacles preferably comprising first and second pluralities of upwardly opening pockets 6 and 6r. Pockets 6 and 6r are preferably variously sized for receiving and securely holding and storing variously sized light bulbs 12. Each of the upwardly opening pockets 6 and 6r preferably incorporates within its lip an elastic band 8 or 8r. Bands 8 and 8r may be outwardly stretched to facilitate inward insertions of light bulbs 12, and may alternately contract over a received bulb for securely holding and retaining the bulb. In the preferred embodiment, label spaces 10 and 10r are associated with each of the pockets 6 and 6r for displaying light bulb size and type indicia. A coat hanger or dress hanger type hook 26 and swivel 27 combination is preferably fixedly attached to the upper end of the support frame 22, such hook allowing the assembly to be conveniently stored upon a closet hanger rod (not depicted within views).

Electronic light bulb testing means are preferably provided, and a preferred embodiment of such means is referred to generally by Reference Arrow 41. In such preferred embodiment, the bulb tester 41 forms a forwardly and upwardly opening "V" channel 42 whose floor supports a vertically extending electrode 46 and whose left and right side walls support vertically and angularly splayed electrodes 44 and 45. In the preferred embodiment, such "V" channel opens forwardly and upwardly at a front face 47 of a rigid and hollow component case 40.

In operation of the bulb tester 41, a user of the instant inventive assembly may extract one of the light bulbs 12 from one of the pockets 6 or 6r, and may position such bulb 12 so that its screw base electrodes 14 and 16 respectively contact electrodes 44,45 and 46. Electrodes 14,16,44,45,46 in combination with the filament 18 of bulb 12 may then constitute components of an electric circuit which, referring further simultaneously to FIG. 3, may include an electric power supply suitably in the form of an external power cable and preferably in the form of a battery 52S housed within a battery compartment 52 of case 40, and further includes electronic sensory output means such as a light emitting diode and resistor combination 48,48S, and/or an electronic speaker 50S housed within the case 40 and supported beneath sound apertures 50.

Figure 3:
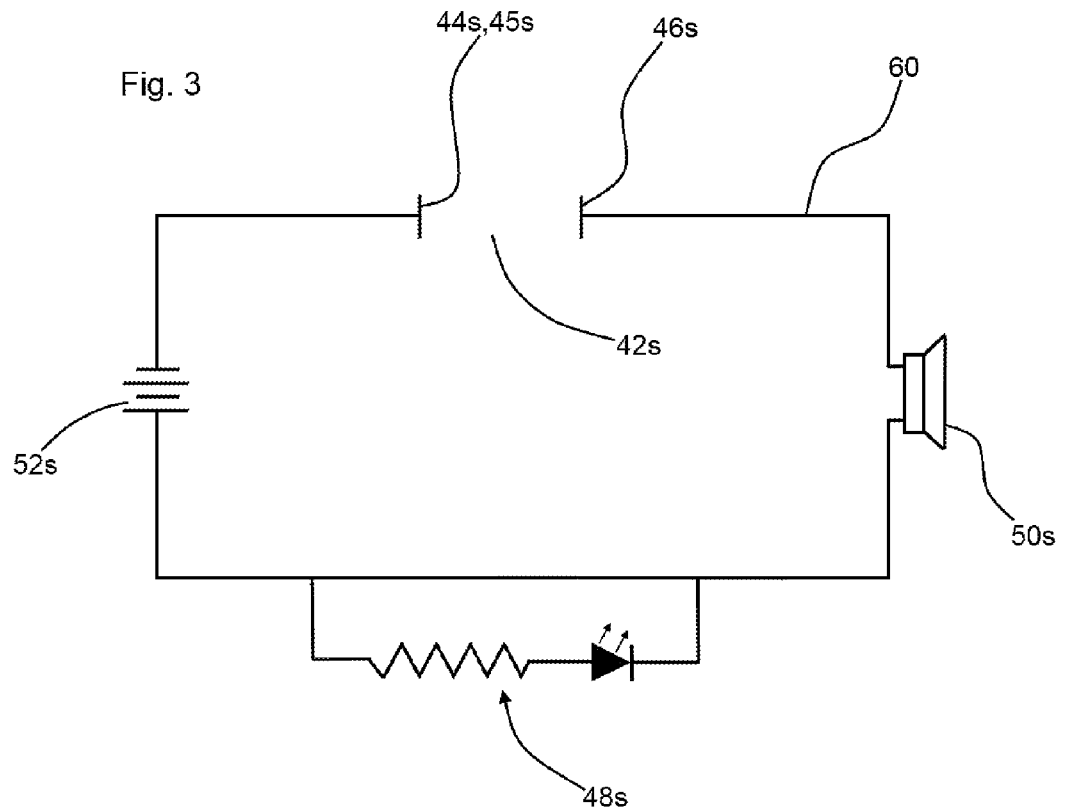
FIG. 3 is a representational electronic schematic diagram of the instant inventive assembly's electronic bulb tester.

In the electrical schematic diagram of FIG. 3, all structures identified by Reference Numerals having the suffix "s" correspond with similarly numbered structures appearing in FIGS. 1 and 2. According to the schematic of FIG. 3, a network of electrically conductive wires 60 interconnects battery 50,52S, light emitter 48,48S, and speaker 50,50S, and the gap 42S between electrical contacts 44S,45S and 46S corresponds with the hollow concavity of the case's "V" channel 42. The battery 52,52S, the light emitter 48,48S, and the speaker 50,50S are intended as being representative of other electronic sensory output devices such as electronic vibrators and electronic dial gauges (neither being depicted within views).

Referring to FIG. 1, the instant inventive assembly further comprises mounting means which are preferably adapted at least for holding and securing the bulb tester 41 at the front face 24 of the support frame 22. Such mounting means suitably comprises a box configured upwardly opening bracket 28 which includes a second "V" channel 30 which may correspond with and directly underlie the "V" channel 42 of case 40. Alternatively, the bracket 28 may comprise a flexible walled pocket fitted for receiving the tester 41. Where the bracket 28 comprises flexible wall material, a cross spanning member 31 (shown in dashed lines) may be incorporated for maintaining the shape and function of "V" channel 30. A light aperture 34 and sound apertures 36 preferably further open such front face 35 of the bracket 28, such apertures 34 and 36 similarly corresponding with and underlying the bulb tester's light emitting diode 48 and speaker holes 50.

Referring simultaneously to FIGS. 1 and 2, the instant invention's mounting means preferably further comprise a similarly configured second bracket 28r including similar "V" channel, light, and sound openings 30r, 34r and 36r. The second bracket 28r is preferably fixedly mounted to the reverse side 24r of the support frame 22. Upon configuration of the invention's mounting means to include such second mounting bracket 28r, the bulb tester 41 may be advantageously alternatively placed within either front bracket 28 as indicated in FIG. 1, or within rear bracket 28r as indicated in FIG. 2.

In use of the instant inventive assembly, the pockets 6 and 6r which are presented upon opposite sides 4 and 4r of the flexible sheet 2 continuously function for receiving light bulbs 12, dispensing light bulbs 12, storing and securely retaining light bulbs 12 in an organized fashion and in accordance with indicia of size and type appearing upon indicia placards, plates, or labels 10 and 10r.

In the event that the screw base 14,16 of one of the bulbs 12 is inserted into "V" channels 42,30 or 42,30r (as the case may be) and in the event that such screw base paired electrodes make contact with electrodes 44,45 and 46, the electrical circuit of FIG. 3 advantageously incorporates the bulb's filament 18. In the event that such filament 18 is intact, a closed circuit is formed, and the light 48,48S and speaker 50,50S are powered and actuated by battery 52,52S via the network of electrically conductive wires 60. Actuation of such light and speaker advantageously causes the user to correctly understand that the bulb 12 is operable. In the event that such filament 18 is broken, the circuit of FIG. 3 remains open without actuating the light or speaker. Absence of actuation of the light 48, 48S and speaker 50, 52S, and the resultant lack of such sensory output correctly informs the user that the bulb 12 is inoperable.

While the principles of the invention have been made clear in the above illustrative embodiment, those skilled in the art may make modifications in the structure, arrangement, portions and components of the invention without departing from those principles. Accordingly, it is intended that the description and drawings be interpreted as illustrative and not in the limiting sense, and that the invention be given a scope commensurate with the appended claims.

The invention hereby claimed is:

1. A light bulb storage and testing assembly comprising:
   (a) a flexible sheet having upper and lower ends, and having front and rear sides;

(b) a support frame having upper and lower ends, and having front and rear sides, the flexible sheet's upper end being fixedly attached to the support frame's lower end;
(c) hanging means fixedly attached to the support frame's upper end;
(d) a first plurality of light bulb receptacles, each receptacle among the first plurality of light bulb receptacles being fixedly attached to the flexible sheet's front side;
(e) electronic bulb testing means comprising a "V" channel having a floor and left and right walls;
(f) mounting means adapted for positioning the electronic bulb testing means below the hanging means;
(g) a plurality of electrodes fixedly attached to one of the "V" channel's walls and to the "V" channel's floor;
(h) electronic sensory output means;
(i) electric power means ; and
(j) a network of electrically conductive wires, the network of electrically conductive wires operatively interconnecting the electrodes, the electronic sensory output means, and the electric power means.

2. The light bulb storage and testing assembly of claim 1 wherein the electronic bulb testing means comprise a case having a front face, the "V" channel extending into and opening at said front face.

3. The light bulb storage and testing assembly of claim 2 wherein the mounting means comprise a first bracket having a front face, the first bracket being fitted for nestingly receiving the case, and further comprising a second "V" channel, the second "V" channel opening the first bracket at the first bracket's front face.

4. The light bulb storage and testing assembly of claim 3 wherein the mounting means position the case at the support frame's front side.

5. The light bulb storage and testing assembly of claim 4 wherein the electronic sensory output means comprise a device selected from the group consisting of incandescent bulbs, light emitting diodes, electronic speakers, electronic buzzers, electronic gauges, and electronic vibrators.

6. The light bulb storage and testing assembly of claim 5 wherein the electric power means comprise an electric storage battery.

7. ht bulb storage and testing assembly of claim 6 wherein the hanger means comprises a hook.

8. ht bulb storage and testing assembly of claim 7 wherein each light bulb receptacle among the first plurality of light bulb receptacle comprises an upwardly opening pocket.

9. The light bulb storage and testing assembly of claim 3 wherein the mounting means further comprise a second bracket having a front face, the second bracket being fitted for alternatively nestingly receiving the case, the second bracket comprising a third "V" channel, the third "V" channel opening the second bracket at the second bracket's front face.

10. The light bulb storage and testing assembly of claim 9 wherein the mounting means position the second bracket at the support frame's rear side.

11. The light bulb storage and testing assembly of claim 10 further comprising a second plurality of light bulb receptacles, each receptacle among the second plurality of light bulb receptacles being fixedly attached to the flexible sheet's rear side.

12. The light bulb storage and testing assembly of claim 11 wherein each receptacle among the first and second pluralities of light bulb receptacles comprises an upwardly opening pocket.

13. The light bulb storage and testing assembly of claim 12 further comprising a plurality of bulb size and type indicia, said indicia being fixedly attached to the flexible sheet's front and rear sides, each such indicia being positioned in association with one of the upwardly opening pockets.

14. The light bulb storage and testing assembly of claim 13 wherein the first and second brackets are further opened by apertures selected from the group consisting of light emitting apertures, sound emitting apertures, and gauge viewing apertures, each such aperture being positioned at one of the faces among the first and second brackets' front faces.

* * * * *